(12) United States Patent
Ferrant

(10) Patent No.: US 6,920,075 B2
(45) Date of Patent: Jul. 19, 2005

(54) AMPLIFIER FOR READING STORAGE CELLS WITH EXCLUSIVE-OR TYPE FUNCTION

(75) Inventor: Richard Ferrant, Esquibien (FR)

(73) Assignee: STMicroelectronics S.A., Montrouge (FR)

( * ) Notice: Subject to any disclaimer, the term of this patent is extended or adjusted under 35 U.S.C. 154(b) by 20 days.

(21) Appl. No.: 10/450,803

(22) PCT Filed: Dec. 14, 2001

(86) PCT No.: PCT/FR01/04004

§ 371 (c)(1),
(2), (4) Date: Jun. 16, 2003

(87) PCT Pub. No.: WO02/49034

PCT Pub. Date: Jun. 20, 2002

(65) Prior Publication Data

US 2004/0036508 A1 Feb. 26, 2004

(30) Foreign Application Priority Data

Dec. 15, 2000 (FR) .......................................... 00 16399

(51) Int. Cl.$^7$ ................................................. G11C 7/00
(52) U.S. Cl. ........................ 365/205; 365/207; 365/210
(58) Field of Search ................................ 365/205, 207, 365/210, 149, 189.07; 326/113, 114, 119

(56) References Cited

U.S. PATENT DOCUMENTS

| 4,831,591 A | | 5/1989 | Imazeki et al. |
| 5,859,548 A | * | 1/1999 | Kong .......................... 326/113 |
| 6,028,453 A | * | 2/2000 | Kong .......................... 326/113 |
| 6,448,818 B1 | * | 9/2002 | Fletcher ....................... 326/119 |

FOREIGN PATENT DOCUMENTS

| EP | 0 460 899 A2 | 12/1991 |
| JP | 63065418 A | 3/1988 |

OTHER PUBLICATIONS

International Search Report from co–pending PCT application No. PCT/FR01/04004, filed Dec. 14, 2001.

* cited by examiner

Primary Examiner—Gene N. Auduong
(74) Attorney, Agent, or Firm—Lisa K. Jorgenson; James H. Morris; Wolf, Greenfield & Sacks, P.C.

(57) ABSTRACT

The invention concerns an amplifier (1), capable of being controlled by an activation signal, for reading storage cells of a crossbar network comprising, for each column, a direct bit line (BLdi) and a reference bit line (BLri), the amplifier being common to two columns and producing an OR-Exclusive type combination of the states of the cells read in said two columns.

18 Claims, 3 Drawing Sheets

AMPLIFIER FOR READING STORAGE CELLS WITH EXCLUSIVE-OR TYPE FUNCTION

BACKGROUND OF THE INVENTION

1. Field of the Invention

The present invention relates to memories made in the form of an array of memory cells in an integrated circuit. The present invention more specifically applies to DRAMs, that is, memories in which the reading of the content of a memory cell is performed by comparison with a precharge level.

2. Discussion of the Related Art

FIG. 1 partially and schematically shows a conventional example of a DRAM structure.

Storage elements or memory cells $C(j, i)$ are arranged in an array. Each storage element is associated with a pair of bit lines BLdi and BLri in a column BLi (of rank i) shown vertically and with a word line (WLj) shown horizontally. The bit lines are common to columns of storage elements and the word lines are common to rows of storage elements. Each storage element $C(j, i)$ of column i and of row j includes, between a bit line (for example, BLdi) and the ground, the series connection of a MOS transistor T and a capacitive element C. The gate of transistor T is connected to word line BLj. The bit line to which the storage element is not connected forms, for this cell, a reference or precharge line. Most often, each bit line alternately forms the precharge line of a storage element one row out of two. Each column BLi of the memory plane is associated with a sense amplifier SAi having the function of comparing the analog levels present on the bit lines in a read cycle of a storage element, for conversion into logic levels. Generally, the bit lines are precharged and an interval of a few hundreds of millivolts at most is measured by means of the comparator constitutive of the sense amplifier of the column, to differentiate a low level (0) from a high level (1).

The structure and operation of a conventional sense amplifier of DRAM cells as well as the selection and precharge elements associated therewith are known and will not be detailed.

In some applications, the logic signals provided by the sense amplifiers of a DRAM cell are combined by a wired state machine to provide a specific result. An example of such an application is the finding of image contours in graphical applications. Combinations of XOR or XNOR type are generally used to locate the contours of a digital image stored in an array of memory cells while respecting the pixel arrangement with respect to the display.

In such applications, the implementation of the logic combinations by means of wired state machines requires, for a same row, several successive combinations due to the individual reading of the memory cells in the array. The performed comparison is generally sequential, which takes time.

SUMMARY OF THE INVENTION

The present invention aims at providing a novel sense amplifier for DRAM cells which enables performing a faster XOR-type logic combination.

The present invention also aims at providing a solution which does not increase the bulk of the input/output circuits of such a memory.

To achieve these and other objects, the present invention provides an amplifier, controllable by an activation signal, for reading memory cells of an array including, for each column, a direct bit line and a reference bit line, the amplifier being common to two columns and performing a combination of XOR type of the states of cells read from these two columns.

According to an embodiment of the present invention, the amplifier includes:

a first branch formed of a first transistor in series with a second transistor and a third transistor between a high voltage terminal and a reference point, the respective gates of the second and third transistors, preferably with N channels, being connected to a first bit line of a first column and to a first bit line of a second column, and the terminal of the first transistor, preferably with a P channel, opposite to the high voltage terminal defining a first output terminal;

a second branch formed of a fourth transistor, of a fifth transistor, and of a sixth transistor connected between the high voltage terminal and the reference point, the respective gates of the fifth and sixth transistors, preferably with N channels, being connected to the first bit line of the first column and to a second bit line of the second column, and the terminal of the fourth transistor, preferably with a P channel, opposite to the high voltage terminal defining a second complementary output terminal; and a seventh and an eighth transistor connecting, respectively, the first output terminal to a first common point between the fifth and sixth transistors and the second output terminal to a second common point between the second and third transistors, the gates of the seventh and eighth transistors, According to an embodiment of the present invention, the amplifier includes a ninth and a tenth transistor, preferably with P channels, respectively connecting the gate of the first transistor and that of the fourth transistor to the high voltage terminal.

According to an embodiment of the present invention, the gates of the ninth and tenth transistors receive said activation signal, an eleventh transistor, preferably with a P channel, the gate of which receives said activation signal connecting, preferably, the gates of the first and fourth transistors.

According to an embodiment of the present invention, said first and second common points are respectively connected, by twelfth and thirteenth transistors, preferably with P channels, to the high voltage terminal.

According to an embodiment of the present invention, the gates of the twelfth and thirteenth transistors receive said activation signal.

According to an embodiment of the present invention, the reference point is connected, by a fourteenth transistor, preferably with an N channel, to a reference voltage.

According to an embodiment of the present invention, the gate of the fourteenth transistor receives said activation signal.

According to an embodiment of the present invention, the amplifier further includes:

a fifteenth transistor, preferably with an N channel, between the first and second transistors of the first branch, the gate of the fifteenth transistor being connected to the second output terminal; and a sixteenth transistor, preferably with an N channel, between the fourth and fifth transistors of the second branch, the gate of the sixteenth transistor being connected to the first output terminal.

According to an embodiment of the present invention, the amplifier is applied to determining the contour of a digital image.

The present invention also provides an integrated circuit DRAM.

BRIEF DESCRIPTION OF THE DRAWINGS

The foregoing and other objects, features and advantages of the present invention, will be discussed in detail in the following non-limiting description of specific embodiments in connection with the accompanying drawings, in which.

DETAILED DESCRIPTION

Figure 1:
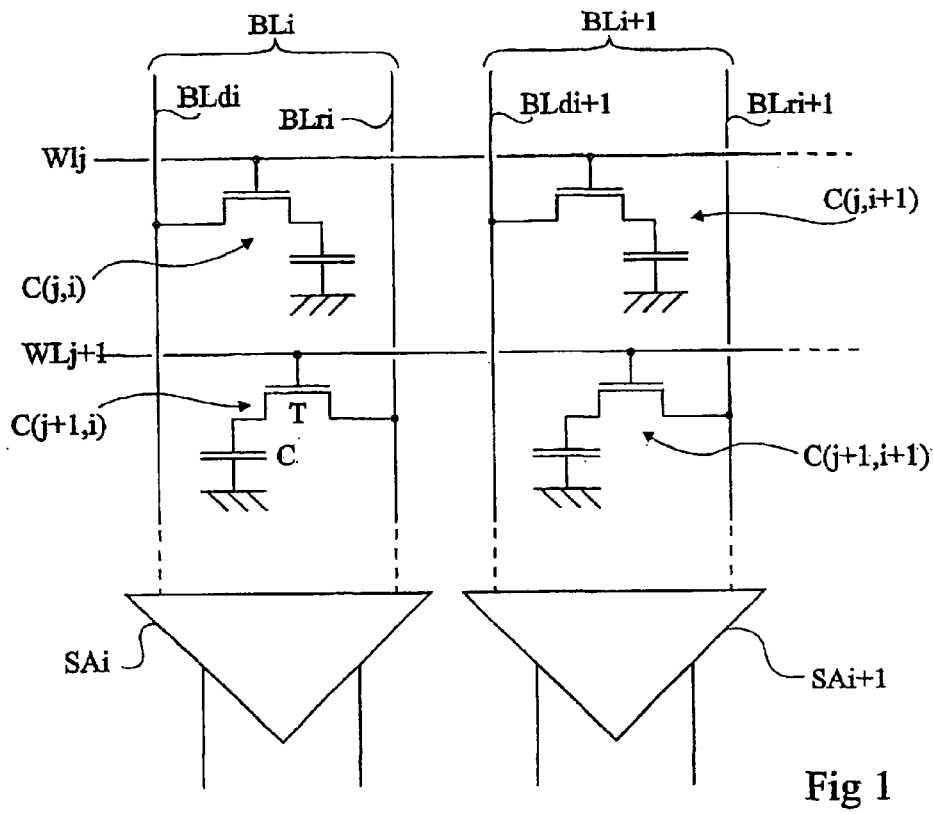
FIG. 1, previously described, shows a conventional example of a DRAM of the type to which the present invention applies.

The same elements have been designated with the same reference numbers in the different drawings. For clarity, only those components of an integrated circuit memory and of its input/output circuits which are necessary to the understanding of the present invention have been shown in the drawings and will be described hereafter. In particular, the respective structures of the column and row selection devices have not been detailed and are no object of the present invention.

A feature of the present invention is to combine, within the sense amplifier, the comparison element enabling detection of the state stored in a cell of the array and an XOR-type combination. In other words, an amplifier according to the present invention performs a comparison of XOR type between the two analog inputs of the sense amplifier.

Figure 2:
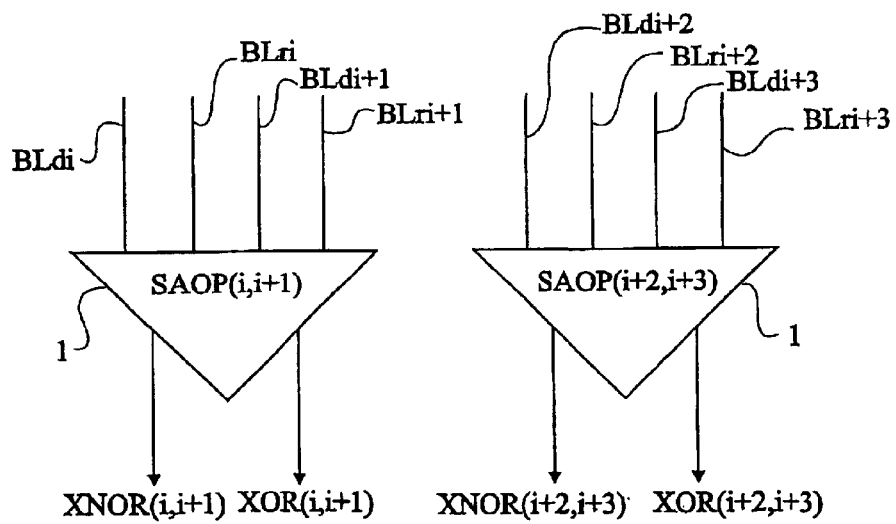
FIG. 2 partially shows the architecture of a memory equipped with amplifier-operators according to the present invention.

FIG. 2 schematically shows the architecture of the inputs/outputs of an array of memory cells according to the present invention at the level of the sense amplifiers.

A feature of the present invention is that each sense amplifier 1 is associated with two columns of the memory cell array, that is, with four bit lines. In the example of FIG. 2, a first amplifier-operator 1 (SAOP(i, i+1)) receives the direct and reference bit lines of columns i and i+1. A second amplifier-operator SAOP(i+2, i+3) receives the direct and reference bit lines of columns i+2 and i+3.

Each amplifier-operator of the present invention provides the logic result of the XOR-type comparison between the two bit lines as well as its complementary (XNOR). Accordingly, the amplifiers of FIG. 2 respectively provide signals XOR(i, i+1), XNOR(i, i+1), and XOR(i+2, i+3), XNOR(i+2, i+3).

Figure 3:
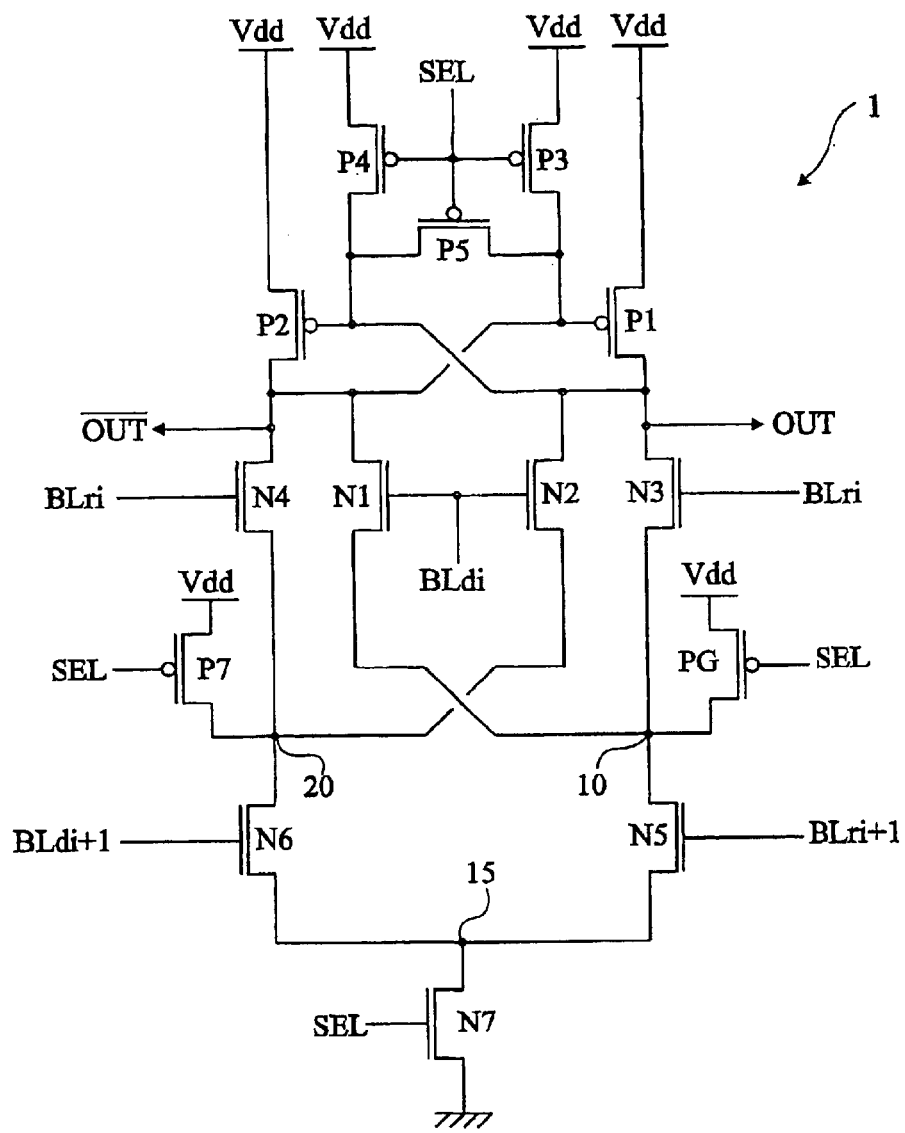
FIG. 3 shows a first embodiment of a sense amplifier with an XOR-type operation according to the present invention.

FIG. 3 shows a first embodiment of an amplifier-operator 1 of the present invention. By arbitrary convention, the bit lines to which reference will be made hereafter are those of columns i and i+1.

An amplifier-operator according to the present invention includes two respectively direct and complementary branches, each providing, on a terminal OUT and $\overline{OUT}$, the result of the XOR comparison and its complement. Terminals OUT and $\overline{OUT}$ are each connected, by a P-channel MOS transistor, respectively P1 and P2, to a high voltage Vdd. The gate of transistor P1 is connected to voltage Vdd by a P-channel MOS transistor P3 having its gate controlled by a selection signal SEL. The gate of transistor P2 is connected to voltage Vdd by a P-channel MOS transistor P4, the gate of which is controlled by signal SEL. A P-channel MOS transistor P5, controlled by this same signal SEL, further connects the gates of transistors P1 and P2. Further, the gate of transistor P1 is connected to terminal $\overline{OUT}$ and, by an N-channel MOS transistor N1, to a point 10 of interconnection between two N-channel MOS transistors N3 and N5 connecting terminal OUT to a reference node 15. Node 15 is connected, by an N-channel MOS transistor N6 controlled by signal SEL, to ground. The gate of transistor P2 is connected to terminal OUT and, by an N-channel MOS transistor N2, to a node 20 of interconnection between two N-channel MOS transistors N4 and N6 connecting terminal $\overline{OUT}$ to node 15. Nodes 10 and 20 are further each connected, by a P-channel MOS transistor, respectively P6 and P7, to high voltage Vdd.

The gates of transistors N1 and N2 are connected to the direct bit line of rank i, BLdi. The gates of transistors N3 and N4 are connected to the reference bit line of rank i, BLri. The gate of transistor N5 is connected to the reference line of rank i+1, BLri+1. The gate of transistor N6 is connected to the direct bit line of rank i+1, BLdi+1. The gates of transistors P6, P7, and N7 receive selection signal SEL.

Since it involves a DRAM cell sense amplifier-operator, the reading is performed by comparing the voltage level of a bit line of each column with the reference line of this column. The logic operation is performed on the so-called analog signals, that is, on a small variation amplitude with respect to a precharge level, as in a conventional sense amplifier.

When signal SEL is inactive (low), both outputs OUT and $\overline{OUT}$ are precharged to the high voltage level (Vdd). Indeed, a low signal SEL turns transistors P3, P4, and P5 on. Voltage level Vdd is thus transferred to the base of transistors P1 and P2 and onto terminals OUT and $\overline{OUT}$. Transistors P1 and P2 are accordingly off and outputs OUT and $\overline{OUT}$ are pulled to the high level. Under the effect of control signal SEL at the low level, transistors P6 and P7 are also on. As a result, transistors N1, N2, N3, and N4 are not responsive to the signals present on lines BLdi and BLri, their respective drains and sources being at the same voltage Vdd (neglecting the voltage drops in the on transistors). Further, since transistor N7 is turned off by signal SEL in the low state, the level of nodes 10 and 20 is maintained whatever the state of transistors N5 and N6. This state of amplifier-operator 1 corresponds to a quiescent state where no reading is performed.

To perform a reading from a dynamic array, one of the bit lines of each pair associated with each column is first conventionally precharged to level Vdd/2. This precharge is generally performed by means of MOS transistors connecting the direct and reference bit lines to the high level. The precharge comprises introducing level Vdd/2 into a reference cell associated with the reference bit line and controlled by a specific word line (not shown). The precharge thus comprises biasing to Vdd/2 a reference line of each pair of bit lines, this reference line corresponding to a line which, for the row to be read from, is connected to no memory cell transistor.

Performing a reading comprises allowing transfer of the levels present on the direct and reference bit lines to the amplifier-operator. For this purpose, separation or isolation transistors, not shown, interposed between the memory cell array and the sense amplifiers-operators on each bit line are conventionally used. Accordingly, what has been illustrated in FIG. 2 as being bit lines BLri, BLdi, BLdi+1, and BLri+1 actually corresponds to the analog inputs of the amplifier-operator, which are connected to the array columns via isolation transistors.

To read and compare the content of two memory cells of a same row by means of an amplifier-operator according to the present invention, the levels present on the direct and reference bit lines are transferred onto the respective gates of transistors N1, N2, N3, N4, N5, and N6. The amplifier-operator is then selected by switching signal SEL to the high state. This turns transistors P3, P4, P5, P6, and P7 off and turns transistor N7 on. The turning-off of transistors P3 to P5 frees the gates of inverter-assembled transistors P1 and P2 to enable reading. The turning-off of transistors P6 and P7 frees nodes 10 and 20 to enable comparison. The turning-on of transistor N7 brings node 15 to ground to set the low state.

The content of the read cell (for example of row j) of column i is assumed to contain a "1". This means that, upon its selection for reading, after addressing by word line WLj, bit line BLdi is brought to a voltage greater than the precharge voltage (for example, Vdd/2). Reference line BLri remains, as for itself, at level Vdd/2. This results in a turning-on of transistors N1 and N2 with a stronger conduction than transistors N3 and N4. The output state is, according to the present invention, conditioned by the states of transistors N5 and N6, themselves conditioned by the reading from the cell of column i+1.

Column i+1 is assumed to also contain, in the read cell, a high state. Line BLri then is at a level greater than the precharge level of line BLri+1. Transistor N5 thus is more conductive than transistor N6. This conduction imbalance causes node 10 to be at a voltage smaller than that of node 20. Accordingly, transistor N1 lowers the voltage of terminal $\overline{OUT}$ faster than transistor N2 lowers the voltage of terminal OUT. Transistor P1 thus turns on, which forces the voltage of terminal OUT to the high state. This confirms the turning-off of transistor P2. A high direct output (OUT) and a low indirect output ($\overline{OUT}$) are thus obtained. This is in accordance with the result of an XOR function having its two inputs in the high state.

If the content of the cell of column i+1 is low, its selection causes a voltage decrease with respect to the precharge level. As a result, transistor N5 is less conductive than transistor N6, which has remained at the precharge level. The conduction imbalance causes a faster lowering of the voltage at node 20 and, accordingly, a stronger conduction of transistor N2. The consequence is that the voltage of terminal OUT decreases and that transistor P2 is turned on. This on state of transistor P2 confirms a high state on terminal $\overline{OUT}$ and confirms the off state of transistor P1, and thus the low state on terminal OUT. This state is coherent with the XOR function when the two inputs have different states.

Now assume that the cell of column i contains a low state. Its selection then causes a faster conduction of transistors N3 and N4 precharged to level Vdd/2 with respect to transistors N1 and N2, the gates of which receive a signal of lower level.

If the cell of rank i+1 contains a state 1, transistor N5 is more strongly conductive. Node 10 lowers faster than node 20 and transistor N3 turns transistor P2 on and lowers output node OUT. As previously, the on state of transistor P2 confirms the off state of transistor P1 and the high output state $\overline{OUT}$. This state is coherent with the XOR function having its two inputs in the low state.

Finally, if the cell of rank i+1 contains a 1, transistor N6 lowers the voltage of node 20 faster and, accordingly, terminal $\overline{OUT}$ falls more rapidly, which turns transistor P1 on and confirms the off state of transistor P2. A state corresponding to the XOR function of two inputs of different states is here reached.

As an alternative, and as known in conventional sense amplifiers, the precharge level may be greater than Vdd/2 (between Vdd/2 and Vdd).

It should be noted that an amplifier-operator of the present invention provides both the result of an XOR operation and of its complementary (XNOR).

An advantage of the present invention is that the output level is obtained very rapidly with respect to a conventional circuit. Indeed, by combining the reading and the logic function, it is no longer necessary to wait for the output states of the sense amplifiers to stabilize, the comparison being performed directly on the analog states. It should however be noted that the output states provided do correspond to logic states. The present inventors have acknowledged, in tests, that the result is available a few hundreds of picoseconds after the switching of the amplifier-operator selection signal.

Another advantage of the present invention is that it reduces the number of transistors necessary to perform the amplifying and the logic comparison with respect to conventional circuits. Indeed, in a conventional read amplifier, at least a dozen transistors are used. For a logic gate of XOR type, the minimum number of transistors is six. Since the present invention processes two columns at once, the number of transistors of the amplifier-operator, which is 14 in the example of FIG. 2, should be compared to the some forty transistors necessary in the conventional case.

Another advantage of the present invention is that the rapidity with which the output states are obtained helps reduce the input and output noise of the amplifier-operator.

Another advantage of the present invention is that the rapidity with which the output states are obtained helps minimizing the input and output noise of the amplifier-operator.

Figure 4:
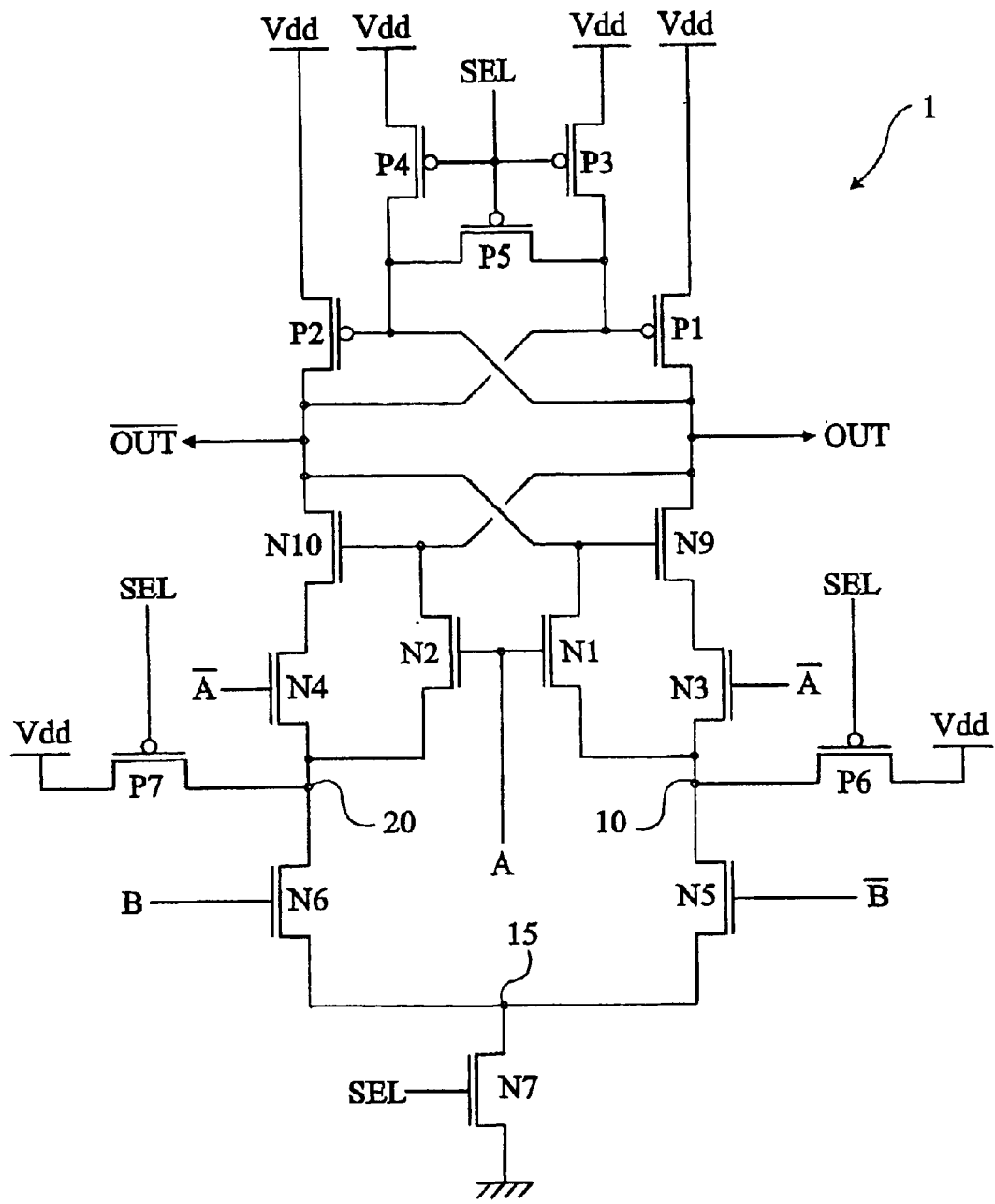
FIG. 4 shows a second embodiment of a sense amplifier with an XOR-type operation according to the present invention.

FIG. 4 shows a second embodiment of an amplifier-operator 1' according to the present invention. As compared to the circuit of FIG. 3, the difference is the addition of two inverter-assembled N-channel MOS transistors N9 and N10 between transistors P1 and N3 and between transistors P2 and N4. The gate of transistor N9 is connected to terminal $\overline{OUT}$ and the gate of transistor N10 is connected to terminal OUT. In FIG. 4, input signals BLdi, BLri, BLdi+1, and BLri+1, have been designated as A, $\overline{A}$, B, and $\overline{B}$.

The function of transistors N9 and N10 is to block the state read from the cell to lock the output states.

The operation of the circuit of FIG. 4 can be deduced from that discussed hereabove in relation with FIG. 3.

An advantage of the circuit of FIG. 4 is that the power consumption of the circuit consumption is eliminated as soon as the output signal is completely established.

To perform an image contour detection, each bit line (each pair of bit lines) may for example be associated with two neighboring amplifiers to compare the column state with respect to the two neighboring columns. XOR-type comparisons are thus successively performed between two neighboring columns. Each column (except for the first and the last one) is thus examined (read from and combined) twice. The number of circuits 1 or 1' of the present invention thus is n−1, where n represents the number of memory plane columns to be examined. In a single read cycle, the separative lines of an image, for example black and white, with the black corresponding to state 1 and the white corresponding to state 0, are determined for a given row.

The above discussion is simplified to illustrate an application of the present invention. This simplified example shows the advantages of the present invention with respect to a separate use of amplifiers and XOR-type gates used sequentially.

Of course, the present invention is likely to have various alterations, modifications, and improvements which will readily occur to those skilled in the art. In particular, the connections of the different bit lines to the amplifiers-operators and the exploitation of the output signals of these amplifiers-operators will depend on the application. Further, the voltage levels (in particular, the used precharge levels) may be modified.

Further, the present invention applies to any read mode conventionally used for DRAMs. For example, the present invention also applies to the case where the reference bit line of each column is dedicated to the reference function, as well as to the case where the reference line of a column actually is the direct line of a neighboring column. Further, the dimensions of the different transistors are within the abilities of those skilled in the art based on the functional indications given hereabove and on the envisaged application.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not as limiting. The invention is limited only as defined in the following claims and the equivalents thereto.

What is claimed is:

1. An amplifier, controllable by an activation signal, for reading memory cells of an array including, for each column, a direct bit line and a reference bit line wherein said amplifier is common to two columns and performs an XOR type combination of the states of cells read from these two columns, wherein the amplifier is applied to determining the contour of a digital image.

2. An integrated circuit DRAM, including the amplifier of claim 1.

3. An amplifier, controllable by an activation signal, for reading memory cells of an array including, for each column, a direct bit line and a reference bit line wherein said amplifier is common to two columns and performs an XOR type combination of the states of cells read from these two columns;

a first branch formed of a first transistor in series with a second transistor and a third transistor between a high voltage terminal and a reference point, the respective gates of the second and third transistors, preferably of N channel type, being connected to a first bit line of a first column and to a first bit line of a second column, and the terminal of the first transistor, preferably of P channel type, opposite to the high voltage terminal defining a first output terminal;

a second branch formed of a fourth transistor, of a fifth transistor, and of a sixth transistor connected between the high voltage terminal and the reference point, the respective gates of the fifth and sixth transistors, preferably of N channel type, being connected to the first bit line of the first column and to a second bit line of the second column, and the terminal of the fourth transistor, preferably of P channel type, opposite to the high voltage terminal defining a second complementary output terminal; and a seventh and an eighth transistor connecting, respectively, the first output terminal to a first common point between the fifth and sixth transistors and the second output terminal to a second common point between the second and third transistors, the gates of the seventh and eighth transistors, preferably of N channel type, being connected to a second bit line of the first column.

4. The amplifier of claim 3, further comprising a ninth and a tenth transistor, preferably with P channels, respectively connecting the gate of the first transistor and that of the fourth transistor to the high voltage terminal.

5. The amplifier of claim 4, wherein the gates of the ninth and tenth transistors receive said activation signal, an eleventh transistor, preferably with a P channel, the gate of which receives said activation signal connecting, preferably, the gates of the first and fourth transistors.

6. The amplifier of claim 4, wherein the reference point is connected, by a fourteenth transistor, preferably with an N channel, to a reference voltage.

7. The amplifier of claim 6, wherein the gate of the fourteenth transistor receives said activation signal.

8. The amplifier of claim 3, wherein said first and second common points are respectively connected, by twelfth and thirteenth transistors, preferably with P channels, to the high voltage terminal.

9. The amplifier of claim 8, wherein the gates of the twelfth and thirteenth transistors receive said activation signal.

10. The amplifier of claim 3, further comprising:

a fifteenth transistor, preferably with an N channel, between the first and second transistors of the first branch, the gate of the fifteenth transistor being connected to the second output terminal; and a sixteenth transistor, preferably with an N channel, between the fourth and fifth transistors of the second branch, the gate of the sixteenth transistor being connected to the first output terminal.

11. An amplifier, controllable by an activation signal, for reading memory cells of an array including, for each column, a direct bit line and a reference bit line, wherein said amplifier is common to two columns and performs an XOR combination of the states of cells read from these two columns, wherein the amplifier further comprises:

a first branch formed of a first transistor in series with a second transistor and a third transistor between a first voltage terminal and a second voltage terminal, the second and third transistors being connected to a first bit line of a first column and to a first bit line of a second column, and a terminal of the first transistor defining a first output terminal;

a second branch formed of a fourth transistor, of a fifth transistor, and of a sixth transistor connected between the first voltage terminal and the second voltage terminal, the fifth and sixth transistors being connected to the first bit line of the first column and to a second bit line of the second column, and a terminal of the fourth transistor, defining a second output terminal; and a seventh and an eighth transistor connecting, respectively, the first output terminal to a first common point between the fifth and sixth transistors and the second output terminal to a second common point between the second and third transistors, the seventh and eighth transistors also being connected to a second bit line of the first column.

12. The amplifier of claim 11, further comprising a ninth and a tenth transistor respectively connecting the first transistor the fourth transistor to the first voltage terminal.

13. The amplifier of claim 12, wherein the ninth and tenth transistors receive said activation signal, an eleventh transistor which receives said activation signal connecting the first and fourth transistors.

14. The amplifier of claim 12, wherein the reference point is connected by a fourteenth transistor to a reference voltage.

15. The amplifier of claim 14, wherein the fourteenth transistor receives said activation signal.

16. The amplifier of claim 11, wherein said first and second common points are respectively connected by twelfth and thirteenth transistors to the first voltage terminal.

17. The amplifier of claim 16, wherein the twelfth and thirteenth transistors receive said activation signal.

18. The amplifier of claim 11, further comprising:
   a fifteenth transistor between the first and second transistors of the first branch, the fifteenth transistor being connected to the second output terminal; and
   a sixteenth transistor between the fourth and fifth transistors of the second branch, the sixteenth transistor being connected to the first output terminal.

* * * * *

UNITED STATES PATENT AND TRADEMARK OFFICE
CERTIFICATE OF CORRECTION

PATENT NO.    : 6,920,075 B2
DATED         : July 19, 2005
INVENTOR(S)   : Richard Ferrant It is certified that error appears in the above-identified patent and that said Letters Patent is hereby corrected as shown below:

<u>Column 2,</u>
Line 30, should read -- transistors, preferably with N channels, being connected to a second bit line of the first column. --.

Signed and Sealed this

Twenty-seventh Day of September, 2005

JON W. DUDAS
*Director of the United States Patent and Trademark Office*